June 20, 1967 A. BINZENHOFER 3,327,175

ASSEMBLY OF PRINTED CIRCUIT BOARDS

Filed March 2, 1965

United States Patent Office 3,327,175
Patented June 20, 1967

3,327,175

ASSEMBLY OF PRINTED CIRCUIT BOARDS

Alfred Binzenhofer, Munchingen, Germany, assignor to International Standard Electric Corporation, New York, N.Y., a corporation of Delaware Filed Mar. 2, 1965, Ser. No. 436,577
Claims priority, application Germany, Mar. 4, 1964, St 21,786
6 Claims. (Cl. 317—101)

The present invention relates to the assembly of means for supporting electric circuits and particularly to sub-assemblies of printed circuit boards and similar wafer-like or wafer-shaped units.

Prior art electric switching units have included assemblies of printed circuit boards arranged on a base plate which have then been inserted into a rack frame. The resulting sub-assemblies have been positioned so that the switching plates are perpendicular to the base plate of the component group and connected to the switching device with plug-in socket strips. Connection of sub-assemblies by direct soldering, particularly in case of printed circuits, or by wrapping techniques is also possible. Moreover, conventional construction includes structures in which the wafer-shaped sub-assembly groups are preferably mounted in parallel to each other on a base plate, leaving a small space in between.

In the construction of such known component groups the connecting elements serve to correct the switching circuits of the sub-assemblies to the component group and simultaneously to fix the mechanical relationship between the respective wafers. If the sizes of the plates of the sub-assemblies exceed a certain maximum dimension the small supporting width of the so called connecting elements, which are generally provided at the edge of the sub-assembly plate touching the base plate, leads to flexibility and mobility in the transverse direction of said plates or wafers. The sub-assembly groups therefore, can touch each other, even with the occurrences of only a relatively small mechanical shock or the like. This may cause short-circuits and mechanical damage to components.

It is a primary object of the invention to provide a fastener for wafer-shaped sub-assembly groups which enables the individual wafers to maintain a stable spacing with respect to each other.

A proposed way of attaining the object consists in positioning the wafers of the sub-assemblies so that they engage protruding sections in corresponding recesses of a spacing means arranged transverse to the wafer's plane and covering several sub-assembly groups. To obtain a sufficiently safe connection between spacer and sub-assembly wafers a very narrow fitting and an easy elastic positioning of the wafer protrudings in the recesses of the spacer must be attained.

A principal advantage of devices constructed according to the invention is that the sub-assembly groups form with the base plate of the switching unit a rigid, mechanical unit, which is resistant against external influences without using additional connections between space or sub-assembly wafers and base plates. In addition, due to this arrangement, deformability of the plates in the direction of their planes is maintained so that longitudinal expansion due to heat does not cause any strain or bulging.

A particular embodiment of the invention is characterized in that a spacer is made like a strip, encroaching several sub-assembly plates and having a grooved profile with transverse slots for the free-standing corners of the wafers of the sub-assemblies. This fixing device is of particularly simple construction, because the spacers themselves consist of very simply shaped profile strips and the sub-assembly wafers are pre-shaped as required.

The fixing device according to the invention can be constructed so that the spacer shows rows of recesses over its entire length. The subdivisions of the spacer, i.e. the neutral spaces between the recesses in a row, can be dimensioned so that with a few variations in construction of prefabricated profile strips a sufficiently exact adaptation to practically all occurring arrangements with varying distances between the wafers is possible.

In case increased rigidity of the entire wafer arrangement is desired, another construction of the device according to the invention is possible, characterized in that a U-shaped metal sheet hull is provided as a spacer enclosing a plurality of parallel-arranged sub-assembly wafers in the direction of the wafer's planes and having recesses at the angle vertex for the free-standing edges of said wafers.

Using this type of construction as a basis, the spacer according to the invention can be used to meet further tasks. Such a construction is characterized in that the spacer encloses through a cap a plurality of sub-assembly groups on at least three sides connected to an invariable potential as an electric shielding.

A further embodiment of the invention enables a particularly advantageous fixing of the spacer to the wafers of the sub-assembly wafers engaging a recess of the spacer is provided with a metal coat while at least one engaging point shows a soldering connection between the metal-coated portion of the wafer and the spacer. Mounting and dismounting of such a fixing point for repair purposes can be made in a simple way with conventional soldering tools. Coating of the respective portion with a metal needs no separate work process when using the conventional printed circuit wafers. Moreover, even for larger sets of wafers only the two end plates and a center plate need to be fastened, whereas the remaining sub-assembly wafers are only connected form-lockingly with the spacer.

Different examples of the invention are represented on the accompanying drawing, wherein.

Figure 1:
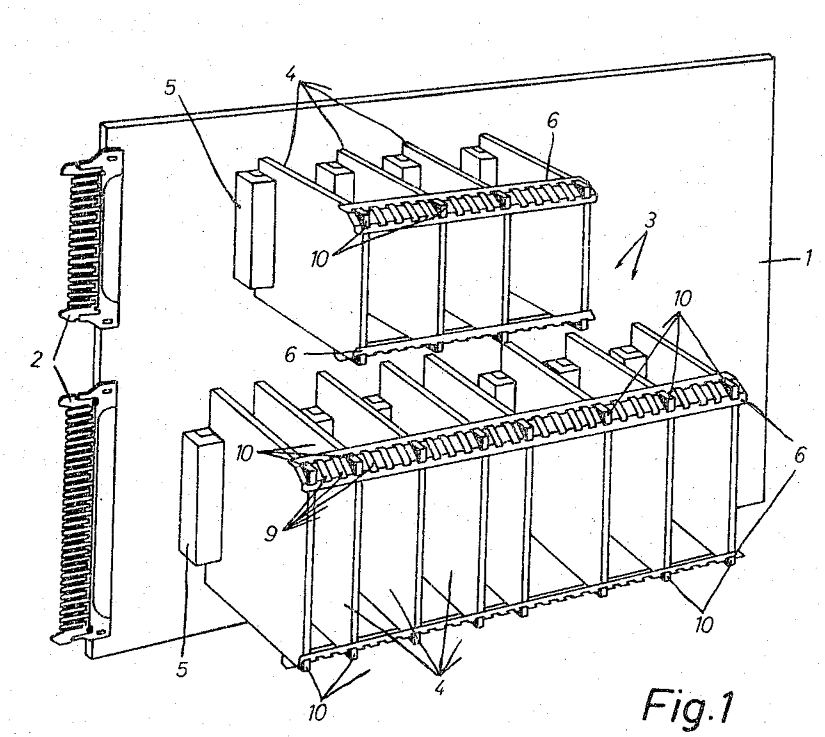
FIG. 1 is a perspective view of a plug-in type component group showing a base plate and two subassemblies.

The assembly shown in FIG. 1 consists of a base plate 1 with plug strips 2 at the edge which engage, when the component groups are inserted into a rack frame or the like (not shown on the drawing) into corresponding socket strips. On the base plate 1 two sets 3 of wafer-shaped sub-assembly groups 4 are mounted. The latter ones are fastened at their vertical edges with angle-type plugs 5 to the base plate, whereby simultaneous connection of the circuitry of the sub-assembly groups with the one of the base plate is made.

For each of both sets 3 of sub-assembly groups two strip-shaped spacers 6 are provided. These spacer strips show a groove-shaped profile whereby the profile limbs 7 are bent outward by an angle of 45° with the base of the profile 8. The strips are provided with transverse slots 9 and encroach in their length always one set of sub-assembly groups. The strips are placed onto the parallel arranged sub-assembly wafers 4 in such a way that the free-standing corners of the wafers 10 engage into a respective transverse slot 9 and the profile limbs 7 tightly touch the edges of the wafers.

Figure 2:
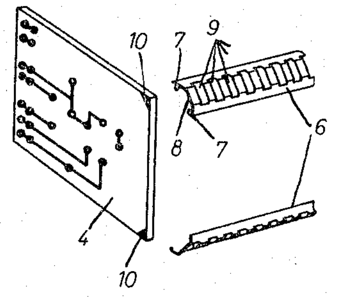
FIG. 2 shows an exploded view of a portion of a sub-assembly including a wafer and two spacers.

The corners 10 of the wafers are provided with metal coats, as may be gathered particularly from FIG. 2, and can be soldered, after placing the spacer strips, with said strips. Generally, it suffices to keep the strips in place and to support the wafers to solder the exterior wafers and one or several of the inside wafers.

Figure 3:
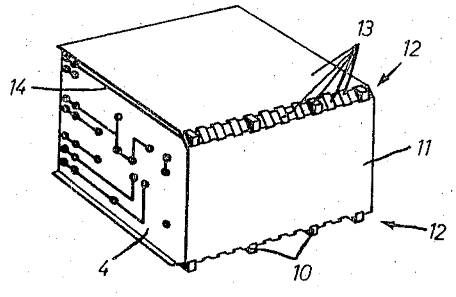
FIG. 3 shows a sub-assembly of wafers in combination with another type of spacer.

FIG. 3 shows a device in which the spacer is formed as a U-shaped metal sheet hull 11. At the vertex 12 of the angle the hull's profile is made oblique to the edges of the wafers with an angle of 45°. In said vertex sections again recesses 13, arranged in rows, are provided to accommodate the corners of the wafers. Due to the coherent shape of the spacer a particular rigidity of the entire wafer set is obtained. Moreover, the metal sheet hull may serve simultaneously as electric shielding of the sub-assembly groups, whereby connection to ground 14, FIG. 3, is favorably made through a soldering point on one corner of the plate or wafer.

While the principles of the invention have been described above in connection with specific apparatus and applications, it is to be understood that this description is made only by way of example and not as a limitation on the scope of the invention.

What is claimed is:

1. An assembly of printed circuit boards comprising,
a group of printed circuit boards of substantially the same size arranged parallel to each other and perpendicular to a plate abutting a first edge of each board,
each of said boards including protruding corners at the ends of a second edge opposite to said first edge, and
a spacer incorporating a plurality of recesses for engaging the protruding corners of each board to control the spacing between boards and to support them in fixed relationship to each other.

2. An assembly of printed circuit boards substantially as claimed in claim 1, in which
the spacer comprises a strip having a cross-section bent to fit against edges adjacent to the protruding corners of each board whereby the boards may be held rigidly by the protruding corners in the recesses.

3. An assembly of printed circuit boards substantially as claimed in claim 2, in which
the recesses are arranged in rows over the entire length of each spacer.

4. An assembly of printed circuit boards substantially as claimed in claim 1 in which
each printed circuit board has two protruding corners and the spacer is a metal sheet bent along two edges and having recesses in rows along each edge to engage the two protruding corners on each of a plurality of printed circuit boards.

5. An assembly of printed circuit boards substantially as claimed in claim 4, in which
the metal sheet extends between the protruding corners of each board and the plate to form a cap capable of electrically shielding the printed circuit boards.

6. An assembly of printed circuit boards substantially as claimed in claim 1 in which
the protruding corners of each board are provided with a metal coating and a soldering connection is made between the metal coating and the spacer.

References Cited

UNITED STATES PATENTS

| | | | |
|---|---|---|---|
| 2,995,686 | 8/1961 | Selvin | 317—101 |
| 3,014,161 | 12/1961 | Tarczy-Hornoch | 339—17 |

ROBERT K. SCHAEFER, *Primary Examiner.*

W. C. GARVERT, J. R. SCOTT, *Assistant Examiners.*